(12) United States Patent
Ito

(10) Patent No.: US 10,943,865 B2
(45) Date of Patent: Mar. 9, 2021

(54) SEMICONDUCTOR MEMORY DEVICE

(71) Applicant: Toshiba Memory Corporation, Minato-ku (JP)

(72) Inventor: Takamasa Ito, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 35 days.

(21) Appl. No.: 16/564,328

(22) Filed: Sep. 9, 2019

(65) Prior Publication Data

US 2020/0303305 A1    Sep. 24, 2020

(30) Foreign Application Priority Data

Mar. 20, 2019  (JP) .............................. JP2019-053331

(51) Int. Cl.
| | |
|---|---|
| *H01L 23/528* | (2006.01) |
| *H01L 23/522* | (2006.01) |
| *H01L 27/1157* | (2017.01) |
| *H01L 27/11582* | (2017.01) |

(52) U.S. Cl.
CPC ...... *H01L 23/5283* (2013.01); *H01L 23/5226* (2013.01); *H01L 27/1157* (2013.01); *H01L 27/11582* (2013.01)

(58) Field of Classification Search
CPC ............. H01L 23/5283; H01L 23/5226; H01L 27/1157; H01L 27/11582
See application file for complete search history.

(56) References Cited

U.S. PATENT DOCUMENTS

| | | | |
|---|---|---|---|
| 2005/0079743 A1* | 4/2005 | Hou .................... | G06F 13/409 439/65 |
| 2015/0179660 A1* | 6/2015 | Yada ................. | H01L 21/02164 257/321 |
| 2017/0294377 A1* | 10/2017 | Dunga ................ | H01L 23/5226 |
| 2018/0211967 A1 | 7/2018 | Shimojo | |
| 2018/0261529 A1 | 9/2018 | Yoshimizu et al. | |
| 2018/0268902 A1 | 9/2018 | Tanaka | |
| 2018/0269219 A1 | 9/2018 | Itoh et al. | |
| 2018/0277477 A1 | 9/2018 | Ishihara | |
| 2019/0057975 A1* | 2/2019 | Kim .................... | H01L 29/1029 |
| 2019/0326310 A1* | 10/2019 | Fukuzumi ......... | H01L 27/11565 |
| 2019/0333922 A1* | 10/2019 | Jung ................. | H01L 27/11519 |

* cited by examiner

*Primary Examiner* — Christine A Enad
(74) *Attorney, Agent, or Firm* — Oblon, McClelland, Maier & Neustadt, L.L.P.

(57) ABSTRACT

According to one embodiment, a device includes: a semiconductor in a first region of interconnects stacked in a first direction; a first conductor including a first body and a first protrusion, the first body provided in a first region, the first protrusion protruding from the first body in a second direction and overlapping with a second region adjacent to the first region in the second direction; a plug on the first protrusion; a insulator between the plug and the interconnects; a second conductor including a second body and a second protrusion, the second body on the first body and contacting the semiconductor, and the second protrusion on the first protrusion and protruding to the second body; and a first layer on the first protrusion, contacting the second protrusion and the insulator, and extending between the second protrusion and the insulator.

15 Claims, 15 Drawing Sheets

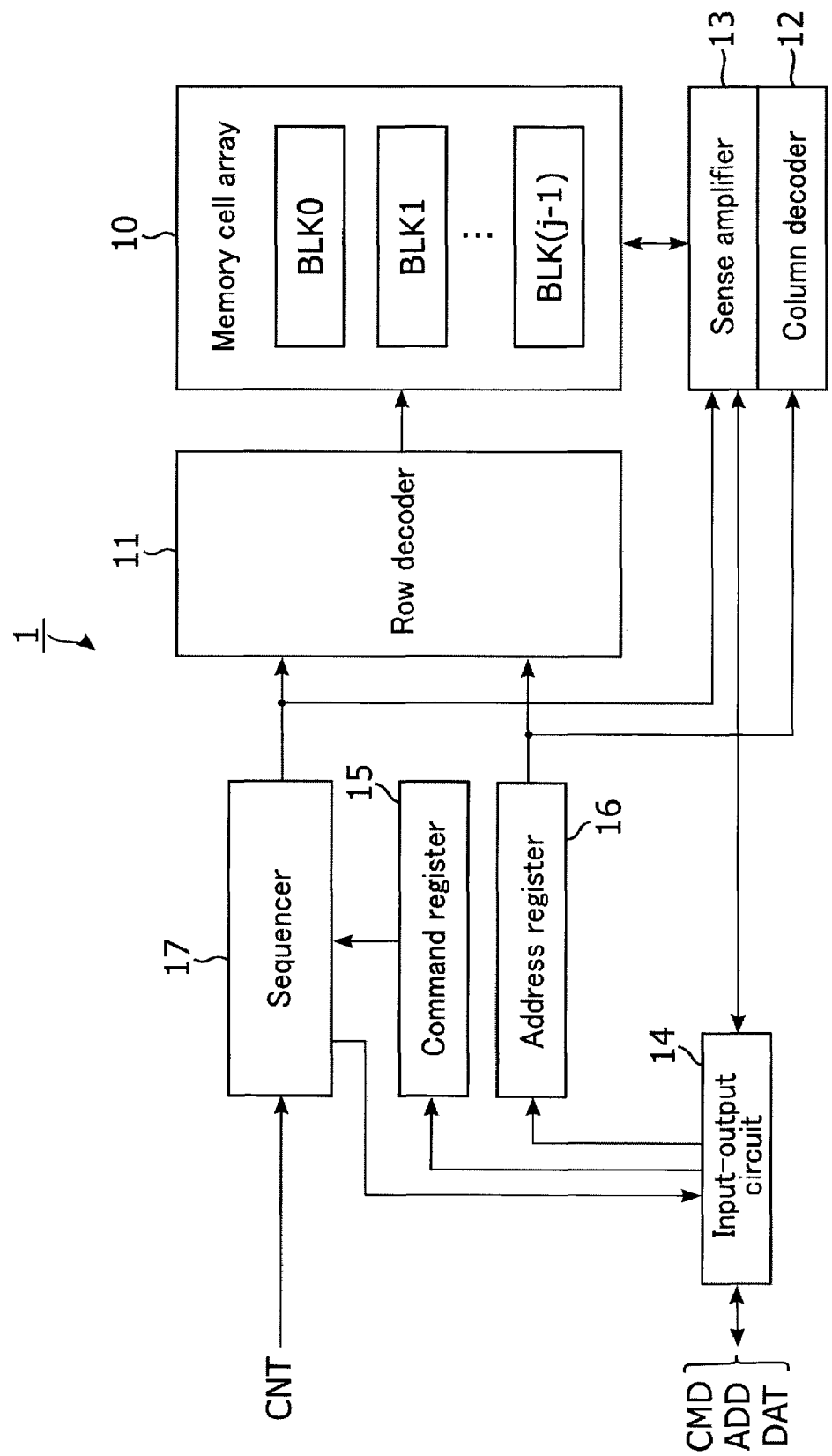
F I G. 1

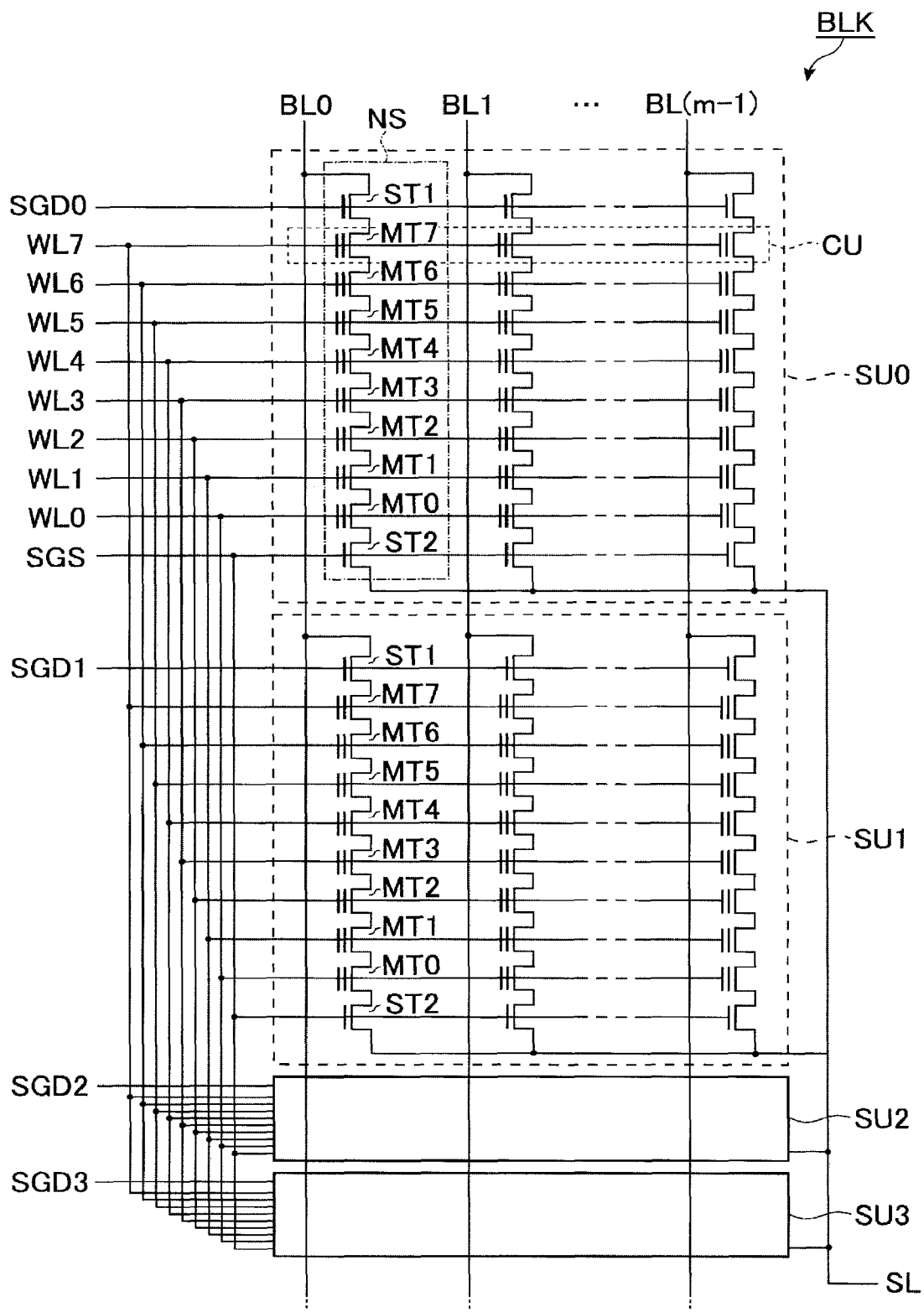
F I G. 2

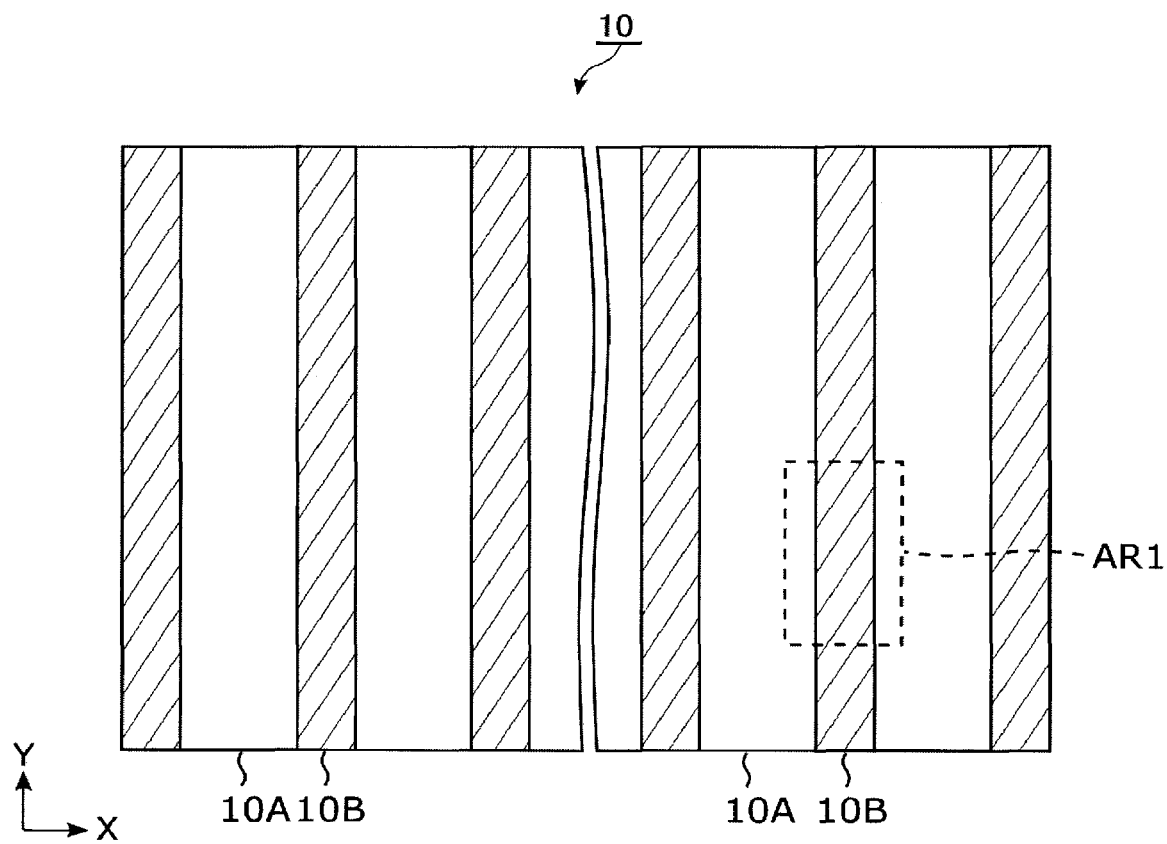
F I G. 3

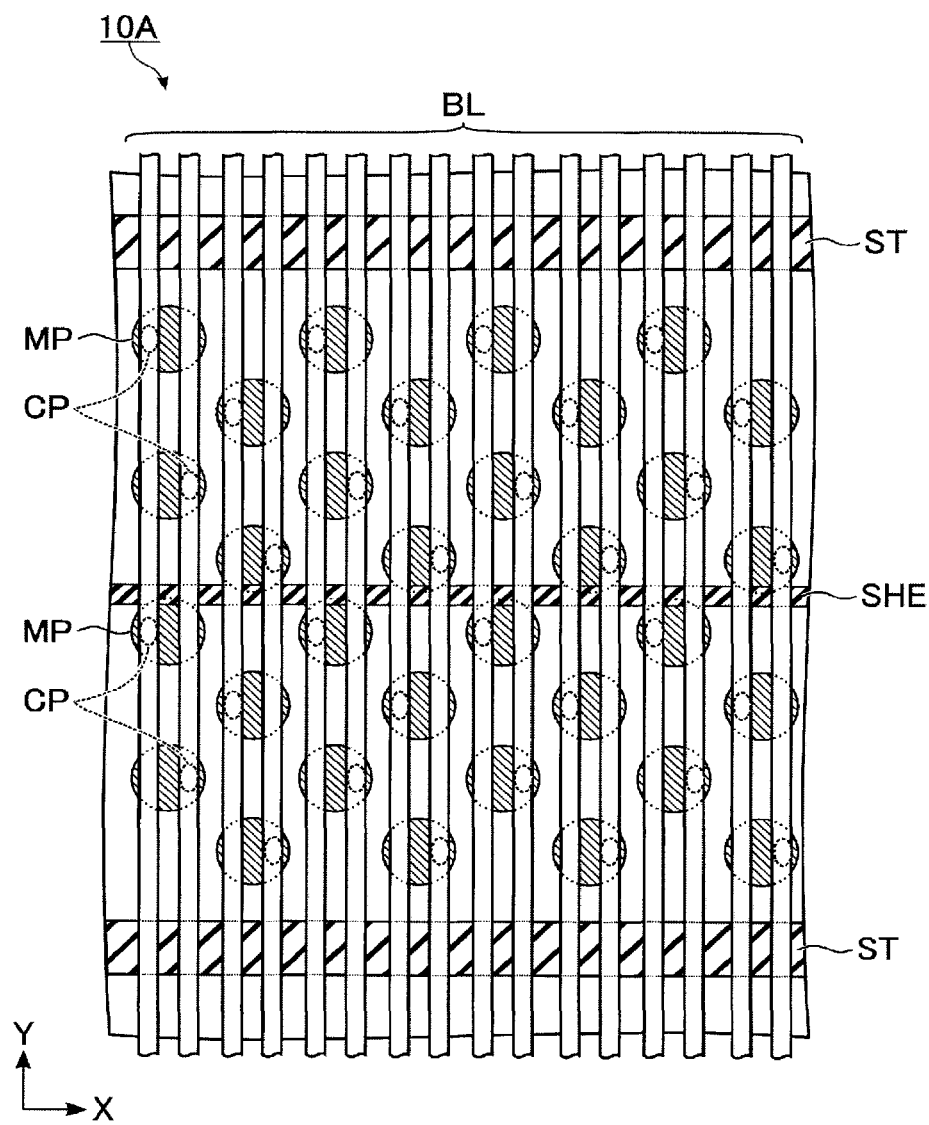
F I G. 4

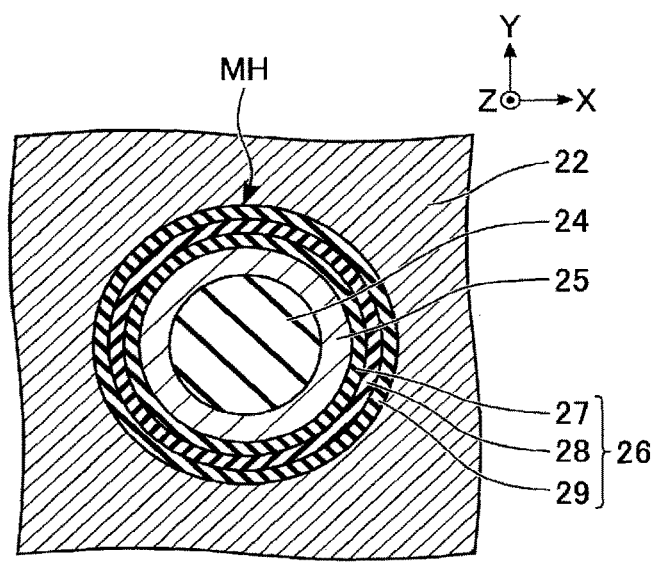
F I G. 6
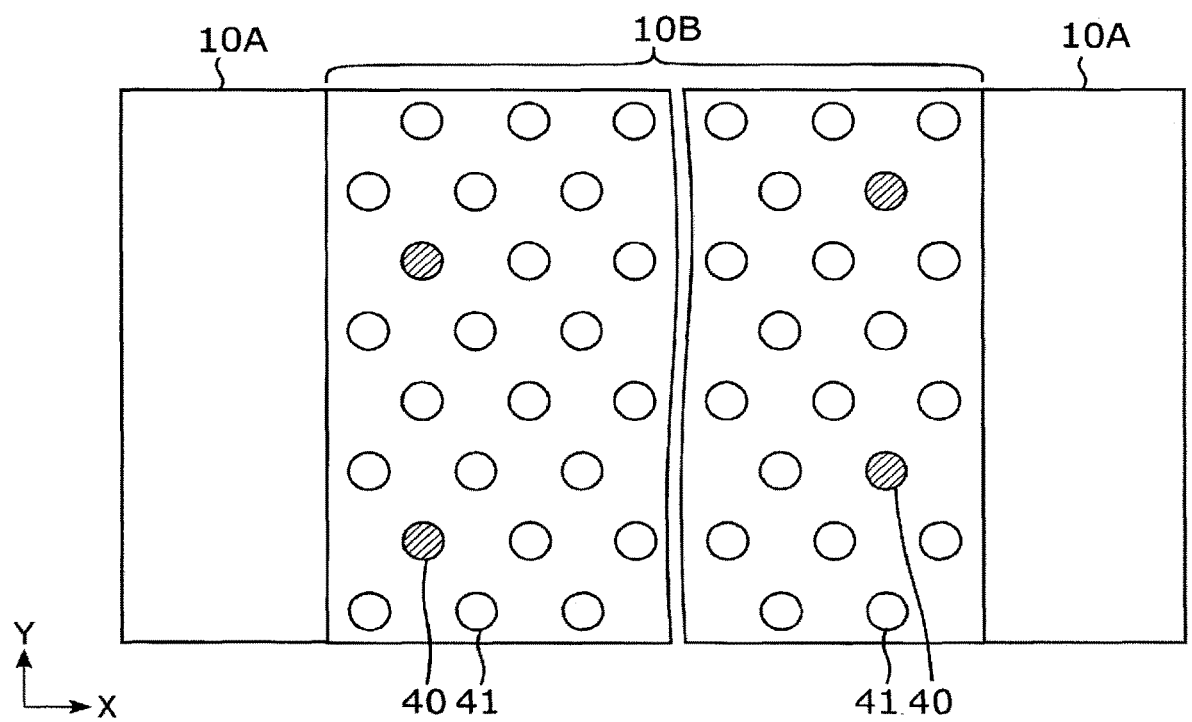
F I G. 7

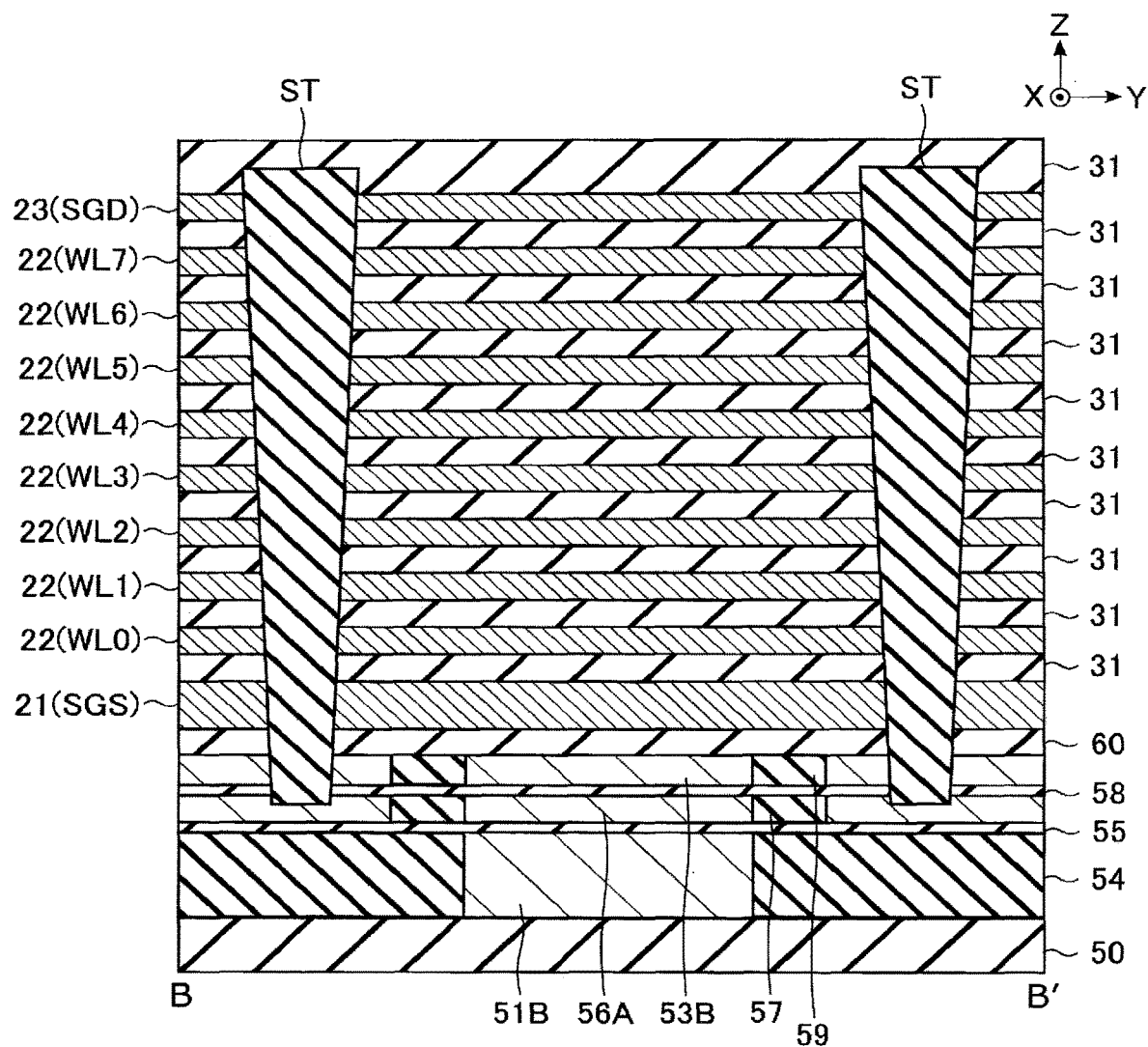
F I G. 11

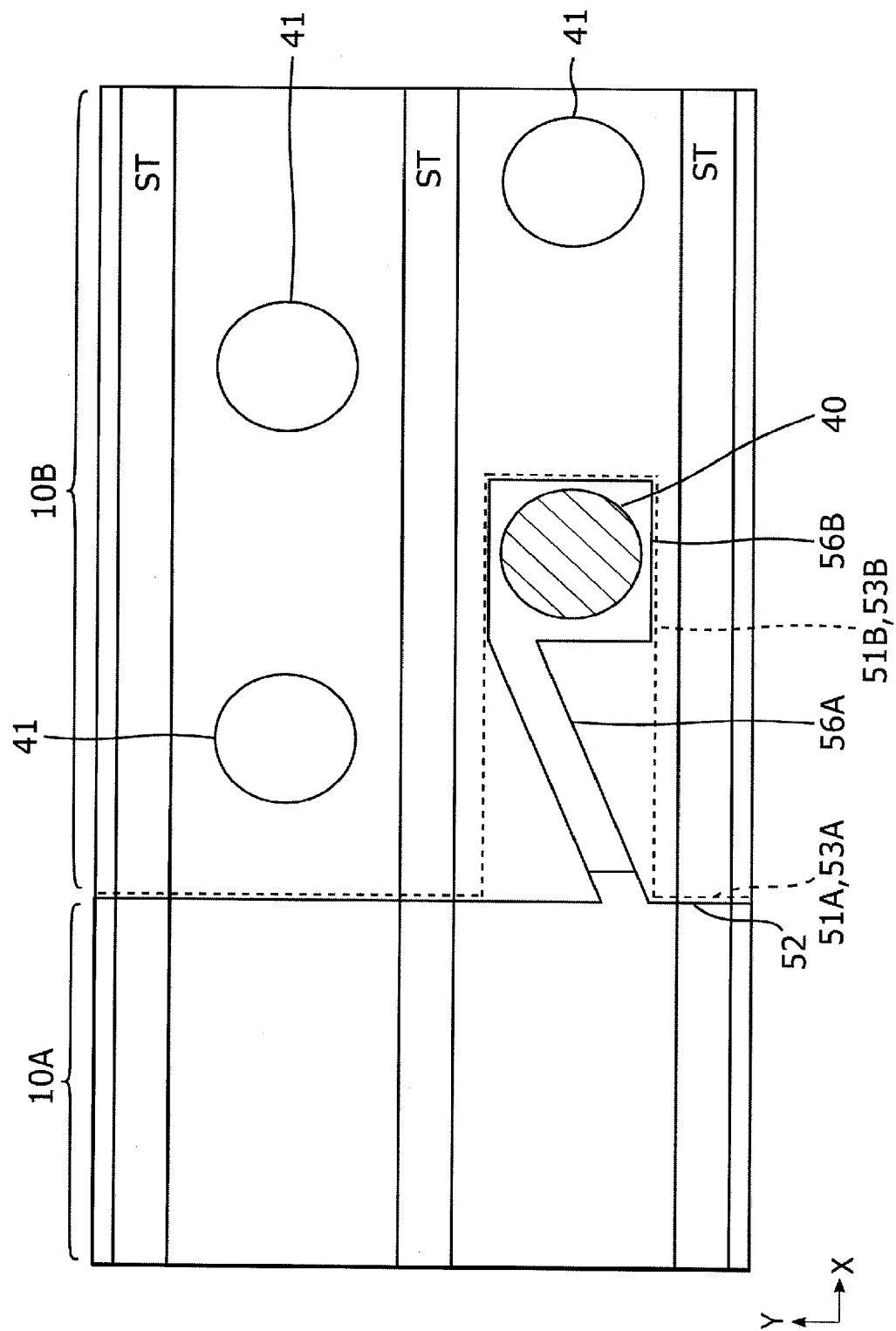
F I G. 12

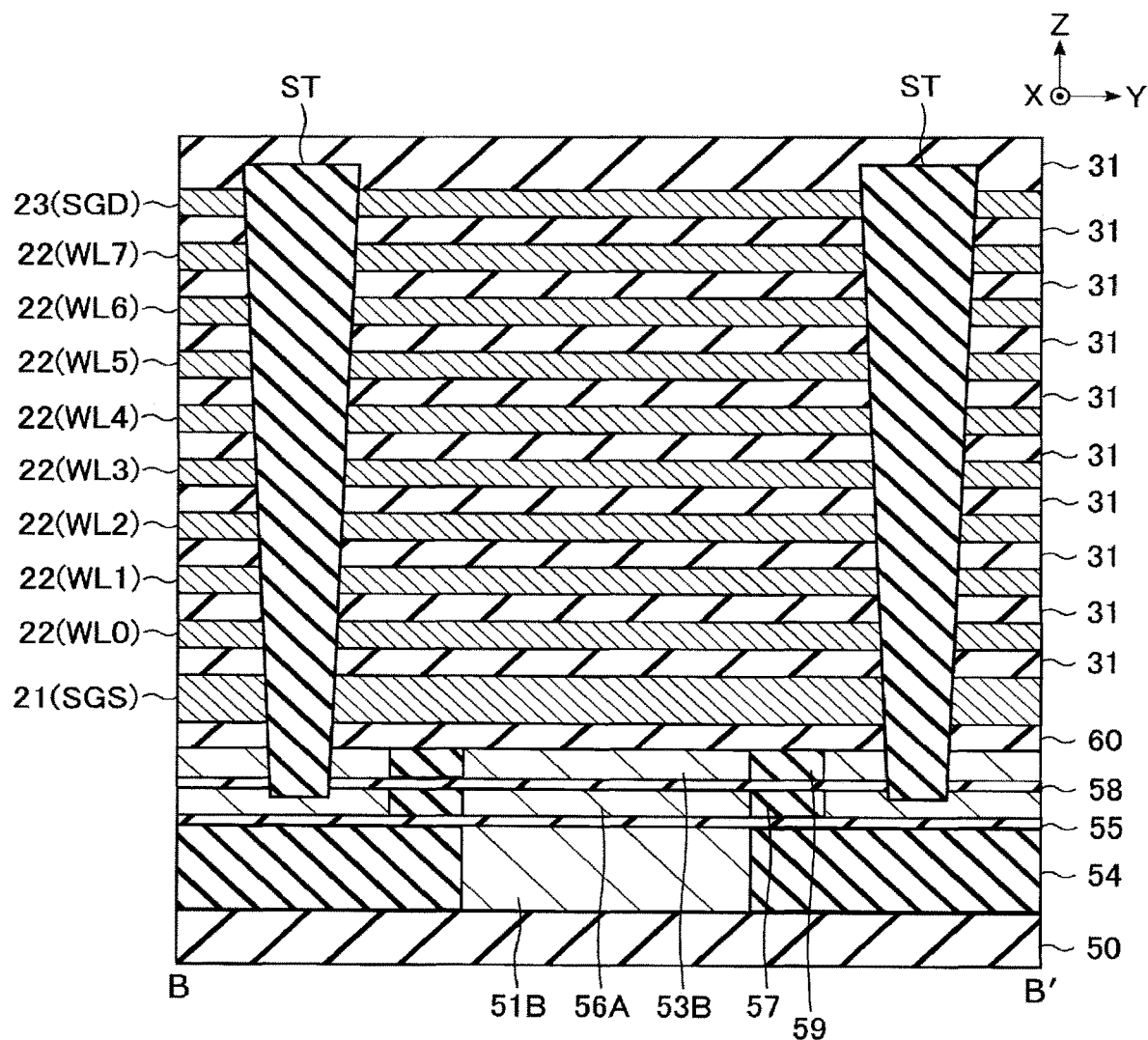
F I G. 16

SEMICONDUCTOR MEMORY DEVICE

CROSS-REFERENCE TO RELATED APPLICATIONS

This application is based upon and claims the benefit of priority from Japanese Patent Application No. 2019-053331, filed Mar. 20, 2019, the entire contents of which are incorporated herein by reference.

FIELD

Embodiments described herein relate generally to a semiconductor memory device.

BACKGROUND

A NAND flash memory is known as a type of semiconductor memory device. A NAND flash memory having three-dimensionally stacked memory cells is also known.

BRIEF DESCRIPTION OF THE DRAWINGS

FIG. 1 is a block diagram of a semiconductor memory device according to a first embodiment.

FIG. 2 is a circuit diagram of a block BLK included in a memory cell array shown in FIG. 1.

FIG. 3 is a plan view of the memory cell array, as viewed in a direction XY.

FIG. 4 is a plan view of a partial region of a cell array section shown in FIG. 3, as viewed in the direction XY.

FIG. 6 is a cross-sectional view of a memory pillar, as viewed in the direction XY.

FIG. 7 is a plan view of a partial region of a tap section shown in FIG. 3, as viewed in the direction XY.

FIG. 11 is a cross-sectional view of the tap section taken along line B-B' in FIG. 9, as viewed in the direction YZ.

FIG. 12 is a plan view of a tap section according to a first modification, as viewed in the direction XY.

FIG. 16 is a cross-sectional view of the tap section 10B taken along line B-B' in FIG. 14.

DETAILED DESCRIPTION

Figure 5:
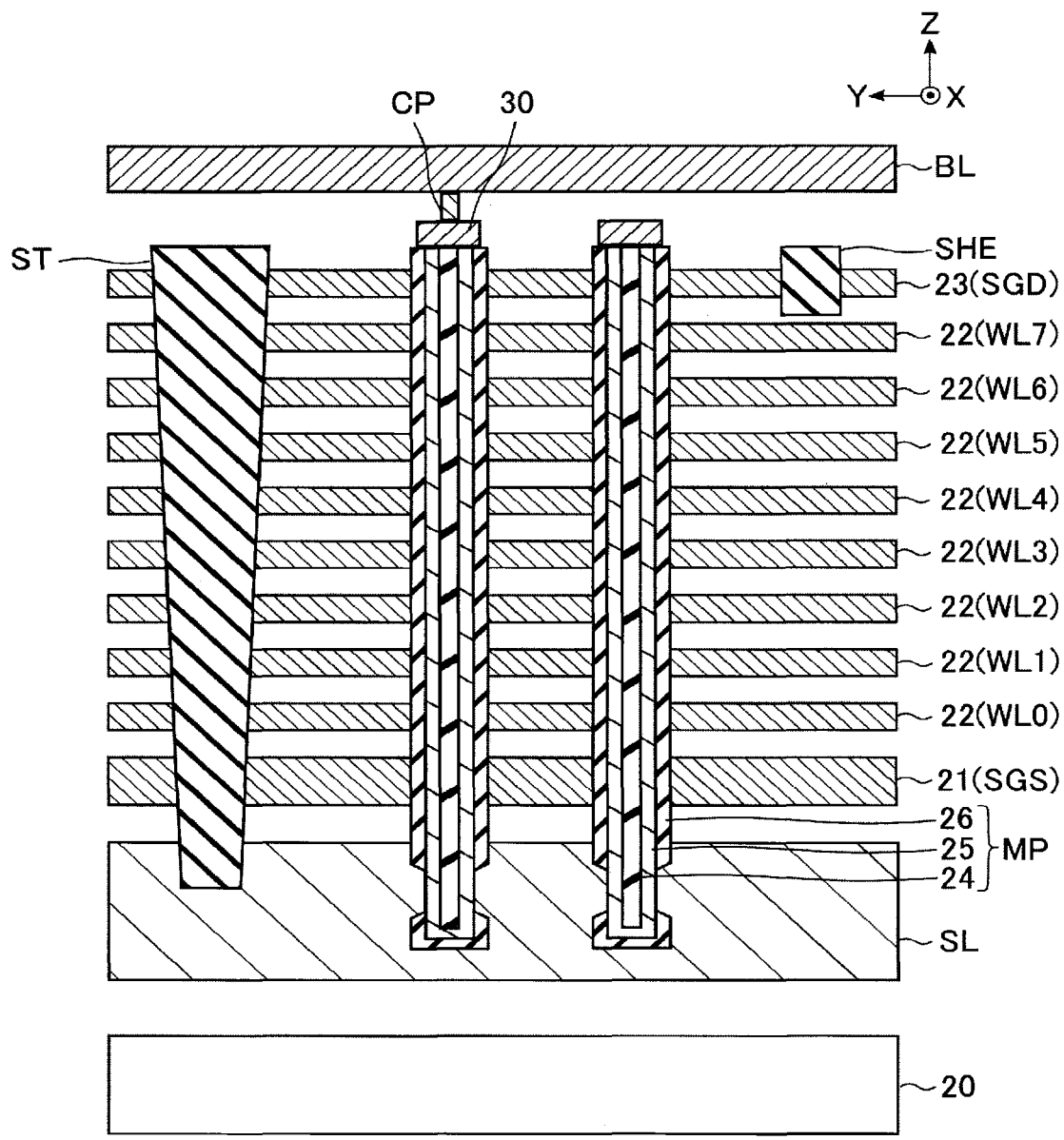
FIG. 5 is a cross-sectional view of the partial region of the cell array section, as viewed in a direction YZ.

Hereinafter, embodiments will be described with reference to the drawings. Some of the embodiments described below serve as mere exemplification of a device and method for embodying the technical idea of the present disclosure; and the shape, configuration, arrangement, etc., of the components do not specify the technical idea of the present disclosure. The drawings are schematic or conceptual, and the relationship between the thickness and the width of the elements, the ratio between the sizes of the elements, etc., are not necessarily the same as the actual ones. Where the same element is illustrated in different drawings, the dimensions and scales may be different between the drawings. In the description below, elements having the same functions and configurations will be denoted by the same reference symbols, the detailed description of the elements will be omitted as appropriate, and differing parts of the elements will be described.

In general, according to one embodiment, a semiconductor memory device includes: a plurality of first interconnect layers stacked in a first direction; a semiconductor layer extending in the first direction in a first region of the plurality of first interconnect layers; a charge storage layer between the plurality of first interconnect layers and the semiconductor layer; a first conductive layer including a first main body and first protrusion, the first main body provided below a lowermost layer of the plurality of first interconnect layers and overlapping with the first region in the first direction, and the first protrusion protruding from the first main body in a second direction crossing the first direction, and overlapping in the first direction with a second region adjacent to the first region in the second direction; a contact plug provided on the first protrusion of the first conductive layer and extending in the first direction in the second region of the plurality of first interconnect layers; a first insulating layer between the contact plug and the plurality of first interconnect layers; a second conductive layer including a second main body and a second protrusion, the second main body provided on the first main body of the first conductive layer and including the semiconductor layer, and the second protrusion provided on the first protrusion and protruding to extend toward the second main body; and a first layer provided on the first protrusion, contacting the second protrusion and the first insulating layer, and extending between the second protrusion and the first insulating layer, wherein a length of a portion extending between the first insulating layer and a boundary between the second main body and the second protrusion, in the second protrusion and the first layer, is greater than a linear distance from the boundary between the second main body and the second protrusion to the first insulating layer.

[1] First Embodiment

[1-1] Block Configuration of Semiconductor Memory Device 1

A semiconductor memory device 1 according to a first embodiment is a NAND flash memory capable of storing data in a non-volatile manner. FIG. 1 is a block diagram of the semiconductor memory device 1 according to the first embodiment.

The semiconductor memory device 1 includes a memory cell array 10, a row decoder 11, a column decoder 12, a sense amplifier 13, an input-output circuit 14, a command register 15, an address register 16, and a sequencer (control circuit) 17, etc.

The memory cell array 10 includes j blocks BLK0 to BLK(j−1), wherein j is an integer of 1 or greater. Each of the blocks BLK includes a plurality of memory cell transistors. The memory cell transistor is formed of an electrically rewritable memory cell. A plurality of bit lines, a plurality of word lines, and a source line, etc., are arranged in the memory cell array 10 in order to control a voltage to be applied to the memory cell transistors. A specific configuration of the block BLK will be described later.

The row decoder 11 receives a row address from the address register 16, and decodes the received row address.

The row decoder 11 selects a word line, etc., based on the decoded row address. Also, the row decoder 11 supplies a plurality of voltages necessary for the write, read, and erase operations to the memory cell array 10.

The column decoder 12 receives a column address from the address register 16, and decodes the received column address. The column decoder 12 selects a bit line based on the decoded column address.

In a read operation, the sense amplifier 13 detects and amplifies data read from the memory cell transistor to the bit line. In a write operation, the sense amplifier 13 transfers write data to the bit line.

The input-output circuit 14 is coupled to an external device (host device) via a plurality of input-output lines (DQ lines). The input-output circuit 14 receives a command CMD and an address ADD from the external device. The command CMD received by the input-output circuit 14 is transmitted to the command register 15. The address ADD received by the input-output circuit 14 is transmitted to the address register 16. Also, the input-output circuit 14 transmits and receives data DAT to and from the external device.

The sequencer 17 receives a control signal CNT from the external device. The control signal CNT includes a chip enable signal CEn, a command latch enable signal CLE, an address latch enable signal ALE, a write enable signal WEn, and a read enable signal REn, etc. The letter "n" attached to the name of the signal denotes that the signal is active low. The sequencer 17 controls the operation of the entire semiconductor memory device 1 based on the command CMD held in the command register 15 and the control signal CNT. Also, the sequencer 17 performs a write operation, a read operation, and an erase operation.

[1-2] Circuit Configuration of Memory Cell Array 10

Next, a circuit configuration of the memory cell array 10 will be described. FIG. 2 is a circuit diagram of a block BLK included in the memory cell array 10 shown in FIG. 1.

Each of the plurality of blocks BLK includes a plurality of string units SU. FIG. 2 shows four string units SU0 to SU3 as an example. The number of string units SU included in one block BLK is discretionary.

Each of the string units SU includes a plurality of NAND strings (memory strings) NS. The number of NAND strings NS included in one string unit SU is discretionary.

Each of the NAND strings NS includes a plurality of memory cell transistors MT, and two select transistors ST1 and ST2. The plurality of memory cell transistors MT are coupled in series between the source of the select transistor ST1 and the drain of the select transistor ST2. In this specification, the memory cell transistors may be called memory cells or cells. FIG. 2 shows a configuration example in which each NAND string NS includes eight memory cell transistors MT (MT0 to MT7) for simplicity; however, the actual number of memory cell transistors MT included in each NAND string NS is greater than eight, and may be set discretionarily. Each memory cell transistor MT includes a control gate electrode and a charge storage layer, and holds data in a nonvolatile manner. The memory cell transistor MT can store 1-bit data or data of 2 or more bits.

The gates of the plurality of select transistors ST1 included in the string unit SU0 are coupled in common to a select gate line SGD0, and select gate lines SGD1 to SGD3 are coupled to the string units SU1 to SU3, respectively. The gates of the plurality of select transistors ST2 included in the string unit SU0 are coupled in common to a select gate line SGS. Likewise, the select gate line SGS is coupled to the string units SU1 to SU3. Individual select gate lines SGS, that is, select gate lines SGS0 to SGS3, may be respectively coupled to the string units SU0 to SU3 included in each block BLK.

The control gates of the memory cell transistors MT0 to MT7 included in each block BLK are coupled to word lines WL0 to WL7.

The drains of the select transistors ST1 of the NAND strings NS, in the same column among the NAND strings NS arranged in a matrix in each block BLK, are coupled in common to any one of bit lines BL0 to BL(m−1), wherein "m" is an integer of one or greater. Furthermore, each bit line BL is coupled in common to the plurality of blocks BLK, and is coupled to one NAND string NS in each string unit SU included in each block BLK. The sources of the select transistors ST2 included in each block BLK are coupled in common to a source line SL. The source line SL is coupled in common to a plurality of blocks BLK, for example.

Data of the plurality of memory cell transistors MT included in each block BLK is, for example, erased in a batch. Each of a read operation and a write operation is performed in a batch on the plurality of memory cell transistors MT coupled in common to a single word line WL arranged in a single string unit SU. A set of the memory cell transistors MT that share a word line WL in a single string unit SU is called a "cell unit CU". A set of 1-bit data stored by each of the memory cell transistors MT included in the cell unit CU is called "a page". Namely, each of the operation of writing to the cell unit CU and the operation of reading from the cell unit CU are performed in units of pages.

The NAND string NS may include a dummy cell transistor. Specifically, two dummy cell transistors (not shown), for example, are coupled in series between the select transistor ST2 and the memory cell transistor MT0. For example, two dummy cell transistors (not shown) are coupled in series between the memory cell transistor MT7 and the select transistor ST1. Dummy word lines are respectively coupled to the gates of the dummy cell transistors. The structure of the dummy cell transistors is the same as that of the memory cell transistors. The dummy cell transistors are not configured to store data but function to alleviate the disturbance that the memory cell transistors or the select transistors receive during write or erase operation.

[1-3] Memory Cell Array 10

Next, the memory cell array 10 will be described. FIG. 3 is a plan view of the memory cell array 10 viewed from the upper side and in the direction XY.

The memory cell array 10 includes a plurality of cell array sections 10A and a plurality of tap sections 10B. In FIG. 3, all the regions that are not hatched are the cell array sections 10A, and all the regions that are hatched are the tap sections 10B.

The plurality of cell array sections 10A and the plurality of tap sections 10B are alternately arranged along the direction X. The cell array sections 10A and the tap sections 10B extend in the direction Y perpendicular to the direction X. The cell array sections 10A are regions where a plurality of memory cells are arranged. The tap sections 10B are regions where a plurality of contact plugs coupling lower interconnects arranged below the memory cell and upper interconnects arranged above the memory cell are arranged. A region AR1 shown in FIG. 3 will be described later.

[1-3-1] Cell Array Section 10A

FIG. 4 is an enlarged plan view of a partial region of the cell array section 10A shown in FIG. 3. The cell array section 10A includes a plurality of memory pillars MP. Each of the plurality of memory pillars MP forms the above-described NAND string NS. The plurality of memory pillars MP are arranged in a plane in a staggered manner, for example.

The plurality of bit lines BL extend in the direction Y, and are arranged in the direction X. Each of the memory pillars MP is electrically coupled to a bit line BL via a contact plug CP.

In the example shown in FIG. 4, two adjacent bit lines BL are arranged to overlap one memory pillar MP. A single bit line is coupled to every two memory pillars MP aligned along the direction Y.

A plurality of slits ST and a plurality of slits SHE are provided in the cell array sections 10A. The slits ST and the slits SHE are formed of an insulating layer, and of silicon oxide ($SiO_2$), for example.

The plurality of slits ST extend in the direction X. The slits ST function to separate each of the word lines WL and each of the select gate lines SGD and SGS. Also, the slits ST function to separate the blocks BLK adjacent to each other in the direction Y.

The plurality of slits SHE extend in the direction X. The slits SHE function to separate the select gate line SGD. Also, the slits SHE function to separate the string units SU adjacent to each other in the direction Y.

FIG. 5 is a cross-sectional view of a partial region of the cell array section 10A taken along a single bit line BL and in the direction YZ.

A substrate 20 is formed of a semiconductor substrate. The source line SL is provided above the substrate 20. An interconnect layer 21 functioning as the select gate line SGS, a plurality of interconnect layers 22 functioning as the plurality of word lines WL (including word lines WL0 to WL7), and an interconnect layer 23 functioning as the select gate line SGD are stacked in the mentioned order above the source line SL, with an insulating layer (not shown) interposed between the respective layers.

Although only one select gate line SGS is shown in the figure, a plurality of select gate lines (for example, three select gate lines) may be provided. In this case, the number of select transistors ST2 provided correspond to the number of select gate lines SGS. Likewise, although only one select gate line SGD is shown in the figure, a plurality of select gate lines (for example, three select gate lines) may be provided. In this case, the number of select transistors ST1 provided correspond to the number of select gate lines SGD.

A plurality of memory pillars MP are provided on the source line SL to pass through the interconnect layers 21 to 23. FIG. 6 is a cross-sectional view of one memory pillar MP taken in the horizontal direction (direction along the plane X-Y). FIG. 6 is a cross-sectional diagram including any one of the interconnect layers 22.

The memory pillar MP is provided inside a memory hole MH. The planar shape of the memory hole MH is, for example, circular. The memory hole MH extends in the direction Z to pass through the interconnect layers 21 to 23. The memory pillar MP includes a core layer 24, a semiconductor layer 25, and a memory film (stacked film) 26.

The core layer 24 extends in the direction Z. The core layer 24 is formed of an insulating layer, and of silicon oxide ($SiO_2$), for example.

The semiconductor layer 25 is provided on the perimeter of the side face of the core layer 24. The semiconductor layer 25 is made of, for example, polycrystalline silicon. The semiconductor layer 25 is a region where channels of the memory cell transistors MT are formed.

The memory film 26 is provided on the perimeter of the side face of the semiconductor layer 25. The memory film 26 includes a tunnel insulation film 27, a charge storage film 28, and a block insulation film 29. The tunnel insulation film 27 contacts the semiconductor layer 25. The block insulation film 29 contacts the interconnect layers 21 to 23. The tunnel insulation film 27 is made of, for example, silicon oxide. The charge storage film 28 is formed of an insulating film, and, for example, silicon nitride (SiN) or a metal oxide (such as hafnium oxide). The block insulation film 29 is made of, for example, silicon oxide.

As shown in FIG. 5, the semiconductor layer 25 is embedded in the source line SL to be electrically coupled to the source line SL. A conductive layer 30 electrically coupled to the semiconductor layer 25 is provided on the memory pillar MP. The contact plug CP is provided on the conductive layer 30. The bit line BL is provided on the contact plug CP.

The slit ST divides each of the interconnect layers 21 to 23 and reaches the source line SL. The slit ST is made of, for example, silicon oxide.

The slit SHE divides the interconnect layer 23. The slit SHE is made of, for example, silicon oxide.

[1-3-2] Tap Section 10B

Next, the tap section 10B will be described. FIG. 7 is a plan view of a partial region of the tap section 10B shown in FIG. 3. FIG. 7 is a plan view of the region AR1 extracted from FIG. 3.

The tap section 10B includes a plurality of first contact plugs 40 and a plurality of second contact plugs 41. Namely, the tap section 10B includes two types of contact plugs 40 and 41. In FIG. 7, the first contact plugs 40 are hatched, and the second contact plugs 41 are not hatched, so that these two types of contact plugs may be distinguished from each other. The density of the arrangement of the first contact plugs 40 is lower than the density of the arrangement of the second contact plugs 41. The planar shapes of the first contact plugs 40 and the second contact plugs 41 are, for example, circular or elliptical. The first contact plugs 40 and the second contact plugs 41 are arranged, for example, in a staggered manner.

The first contact plugs 40 are electrically coupled to the source line SL that is provided in contact with the lower ends of the memory pillars MP in the cell array section 10A. Also, the first contact plugs 40 electrically couple an interconnect arranged above the memory cells and the source line SL. The first contact plugs 40 are arranged near the cell array sections 10A.

The second contact plugs 41 are electrically coupled to an interconnect arranged below the source line SL and to an element formed on the substrate 20. The second contact plugs 41 electrically connect the interconnect arranged above the memory cells and the element formed on the substrate 20, etc.

Figure 8:
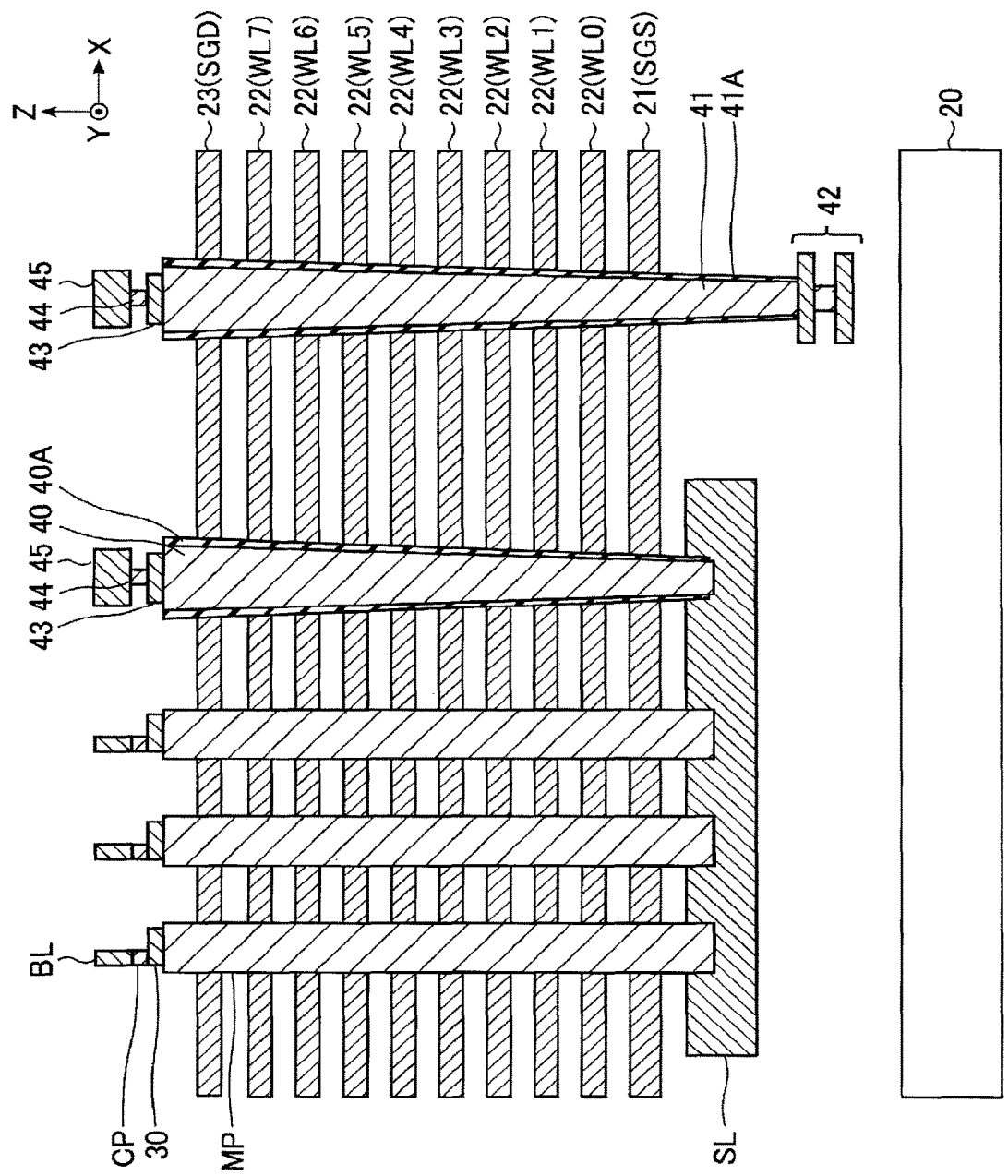
FIG. 8 is a cross-sectional view of a contact plug included in the tap section, as viewed in a direction XZ.

FIG. 8 is a cross-sectional view of the first contact plugs 40 and the second contact plugs 41 included in the tap section 10B.

First, a cross-sectional structure of the first contact plugs 40 will be described. The first contact plugs 40 are provided on the source line SL to pass through the interconnect layers 21 to 23. The first contact plugs 40 are made of metal such as tungsten (W). An insulating film 40A is provided on the perimeter of the side face of the first contact plugs 40. The insulating film 40A is made of, for example, silicon oxide. The first contact plugs 40 are electrically insulated from the interconnect layers 21 to 23 by the insulating film 40A.

An electrode 43 is provided on the first contact plugs 40. A contact plug 44 is provided on the electrode 43. An upper interconnect layer 45 is provided on the contact plug 44.

Next, a cross-sectional structure of the second contact plugs 41 will be described. A lower interconnect layer 42 is provided above the substrate 20. The lower interconnect layer 42 is electrically coupled to the element formed on the substrate 20. The element formed on the substrate 20 includes a p-channel MOS transistor and an n-channel MOS transistor, etc.

The second contact plugs 41 are provided on the lower interconnect layer 42 to pass through the interconnect layers 21 to 23. The second contact plugs 41 are made of a metal such as tungsten (W). An insulating film 41A is provided on the perimeter of the side face of the second contact plugs 41. The insulating film 41A is made of, for example, silicon oxide. The second contact plugs 41 are electrically insulated from the interconnect layers 21 to 23 by the insulating film 41A.

The electrode 43, the contact plug 44, and the upper interconnect layer 45 are provided on the second contact plugs 41 in the mentioned order.

[1-4] Detailed Structure of Tap Section 10B

Figure 9:
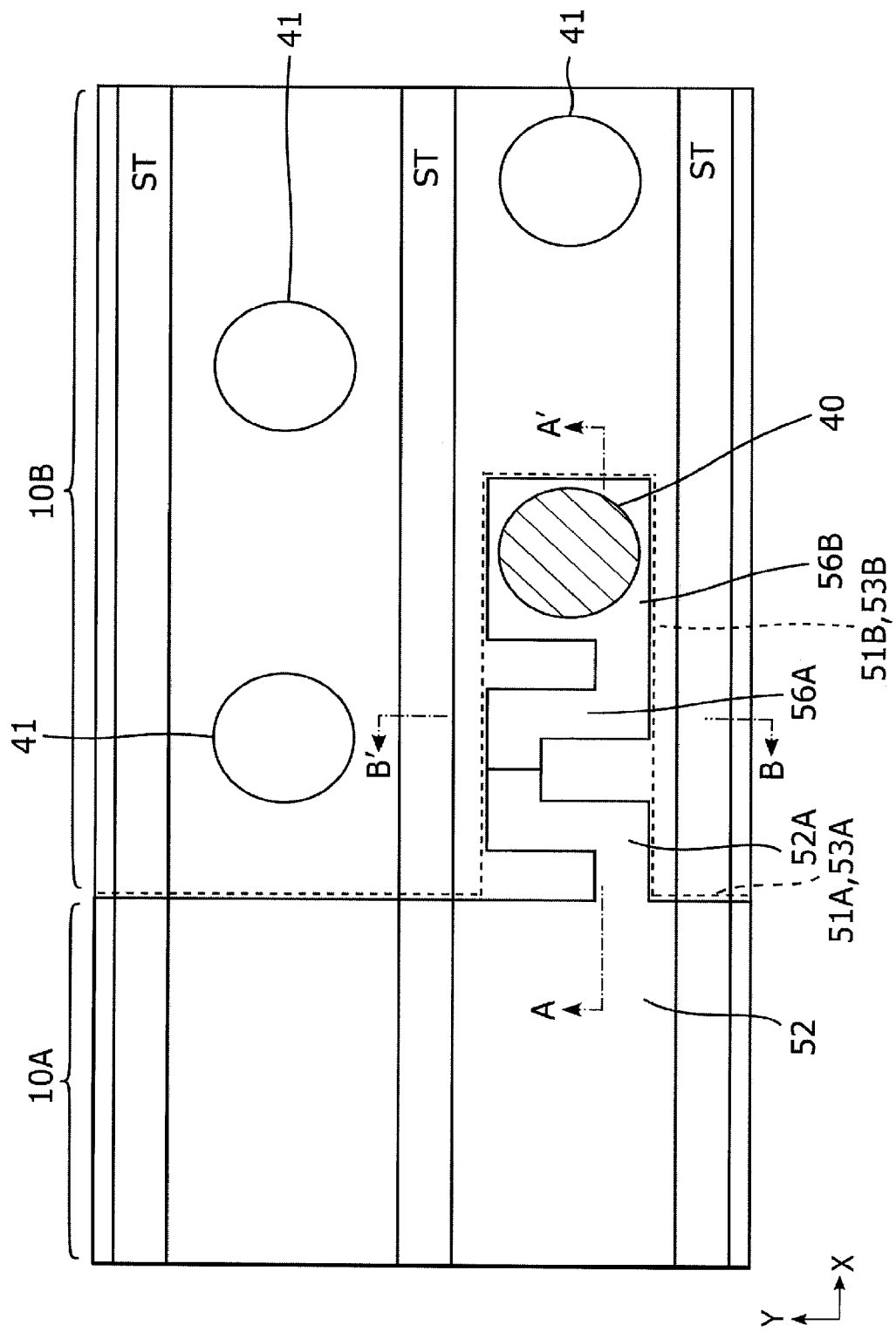
FIG. 9 is a plan view of the tap section, as viewed in the direction XY.
Figure 10:
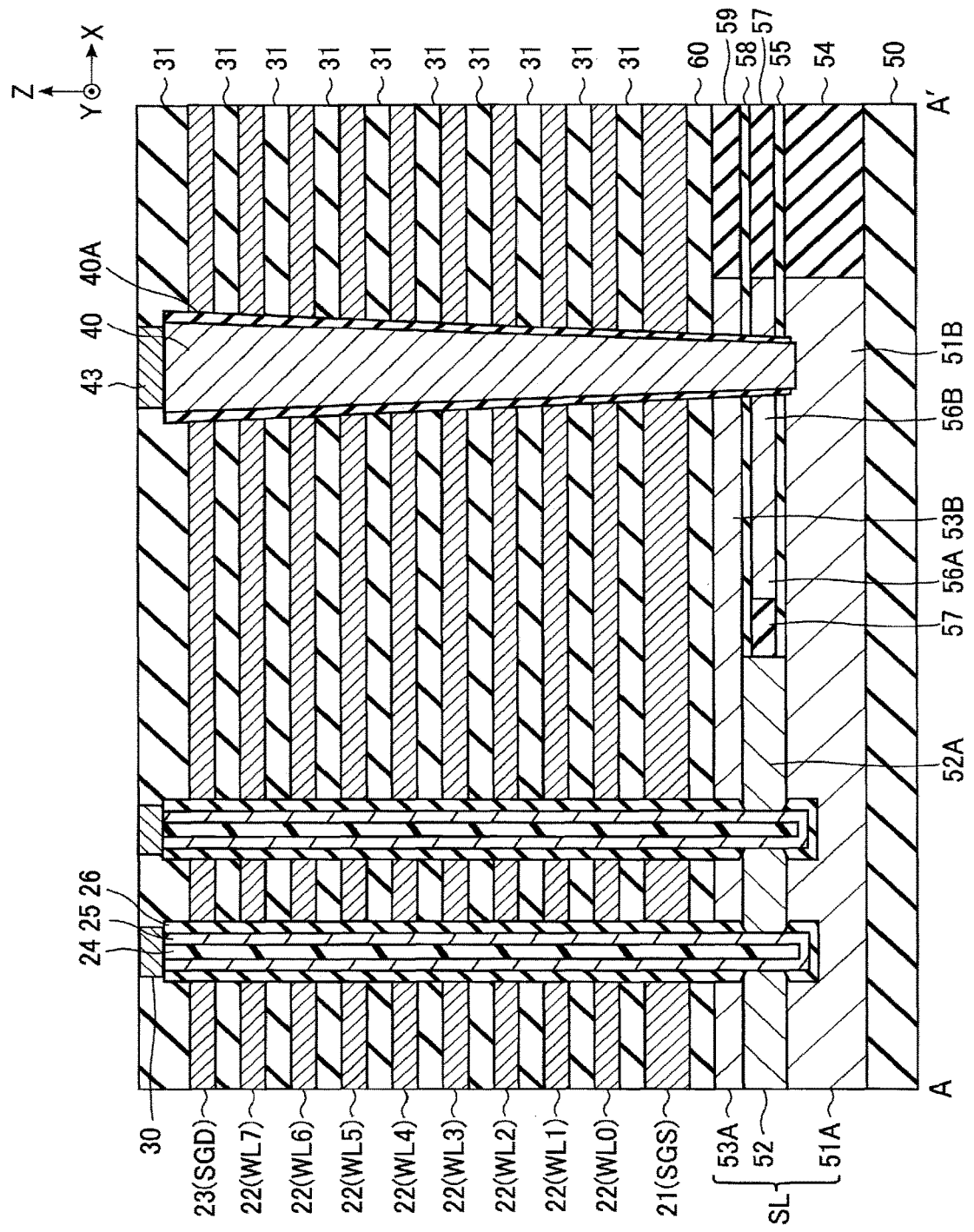
FIG. 10 is a cross-sectional view of the tap section taken along line A-A' in FIG. 9, as viewed in the direction XZ.

Next, a detailed structure of the tap section 10B will be described. FIG. 9 is a plan view of the tap section 10B. FIG. 10 is a cross-sectional view of the tap section 10B taken along line A-A' in FIG. 9. FIG. 11 is a cross-sectional view of the tap section 10B taken along line B-B' in FIG. 9.

An insulating layer 50 is provided on the substrate 20 (not shown). A conductive layer 51A, a conductive layer 52, and a conductive layer 53A are stacked on the insulating layer 50 in the cell array section 10A in the mentioned order. The conductive layer 51A, the conductive layer 52, and the conductive layer 53A form the source line SL. The conductive layer 51A, the conductive layer 52, and the conductive layer 53A are formed in the entire cell array section 10A, and the planar shape of the conductive layer 51A, the conductive layer 52, and the conductive layer 53A is substantially the same as the planar shape of the cell array section 10A. The conductive layer 51A, the conductive layer 52, and the conductive layer 53A are electrically coupled with one another. The conductive layer 52 is in direct contact with the semiconductor layer 25 of the memory pillar MP. The conductive layer 51A, the conductive layer 52, and the conductive layer 53A are made of, for example, polycrystalline silicon. The conductive layer 52 may be formed of metal.

A conductive layer 51B is provided on the insulating layer 50 in the tap section 10B. The conductive layer 51B is made of the same material as that of the conductive layer 51A, and is formed of a layer that continues with the conductive layer 51A. The conductive layer 51B extends from part of the conductive layer 51A in the direction X to reach an area below the first contact plugs 40. The planar shape of the conductive layer 51B is quadrilateral. The conductive layer 51B contacts the first contact plugs 40 and is electrically coupled to the first contact plugs 40.

The insulating layer 54 is provided on the perimeter of the side faces of the conductive layers 51A and 51B. The insulating layer 54 is made of, for example, silicon oxide.

A conductive layer 52A protruding from the conductive layer 52 in the direction X is provided on the conductive layer 51B. The conductive layer 52A is electrically coupled to the conductive layer 52, and is made of the same material as that of the conductive layer 52. The conductive layer 52A has bends. The conductive layer 52A is formed of a plurality of portions extending in the direction X and a plurality of portions extending in the direction Y that are alternately connected. In the example shown in FIG. 9, the conductive layer 52A includes: a first portion that contacts the conductive layer 52 and extends in the direction X; a second portion that extends from the first portion in the direction Y; and a third portion that extends from the second portion in the direction X and contacts a sacrifice layer 56A, which will be described later.

An insulating layer 55 is provided on the conductive layer 51B and the insulating layer 54. The insulating layer 55 is made of, for example, silicon oxide ($SiO_2$), silicon nitride (SiN), or aluminum oxide (AlO).

The sacrifice layer 56A and a sacrifice layer 56B are provided above the conductive layer 51B and on the insulating layer 55. The sacrifice layer 56A and the sacrifice layer 56B are made of the same material, and are formed of a continuous layer. The sacrifice layer 56A and the sacrifice layer 56B are included in a layer at the same level as the conductive layer 52 included in the source line SL.

The first contact plugs 40 pass through the sacrifice layer 56B. The area of the sacrifice layer 56B is larger than the area of the first contact plugs 40. The planar shape of the sacrifice layer 56B is quadrilateral. The sacrifice layer 56B contacts the insulating film 40A on the perimeter of the first contact plugs 40 and is electrically insulated from the first contact plugs 40.

The sacrifice layer 56A contacts the conductive layer 52A and extends to the sacrifice layer 56B. The sacrifice layer 56A has bends. The width of the sacrifice layer 56A is smaller than the width of the sacrifice layer 56B in the direction Y. The sacrifice layer 56A is formed of a plurality of portions extending in the direction X and a plurality of portions extending in the direction Y that are alternately connected. In the example shown in FIG. 9, the sacrifice layer 56A includes: a first portion that contacts the conductive layer 52A and extends in the direction X; a second portion that extends from the first portion in the direction Y; and a third portion that extends from the second portion in the direction X and contacts the sacrifice layer 56B.

The length of the conductive layer 52A and the sacrifice layer 56A along the bent portions is greater than the linear distance from the boundary of the source line SL (specifically, the conductive layers 51A, 52, and 53A) to the first contact plugs 40. Also, the length of the conductive layer 52A and the sacrifice layer 56A along the bent portions is greater than the linear distance from the boundary of the source line SL (specifically, the conductive layers 51A, 52, and 53A) to the insulating film 40A.

The sacrifice layer 56A and the sacrifice layer 56B are formed of the same material as that of a sacrifice layer formed in the cell array section 10A in the step of forming the conductive layer 52 included in the source line SL, and are included in a layer at the same level as said sacrifice layer. Also, a conductive layer at the same level as the sacrifice layer 56A and the sacrifice layer 56B is used as an etching stopper when forming the slit ST.

The sacrifice layer 56A and the sacrifice layer 56B are made of, for example, amorphous silicon or polycrystalline silicon. Also, the sacrifice layer 56A and the sacrifice layer 56B are made of non-doped amorphous silicon, or amorphous silicon doped with any one of phosphorus (P), boron (B), or carbon (C). The sacrifice layer 56A and the sacrifice layer 56B may be made of an insulating material such as silicon nitride (SiN).

The conductive layer 52 included in the source line SL is formed in a region which is itself formed by the performance of wet etching on the sacrifice layer 56A and the removal of the sacrifice layer by said wet etching. The boundary between the conductive layer 52A and the sacrifice layer 56A corresponds to an end portion of the sacrifice layer 56A unremoved by the wet etching. Therefore, the boundary between the conductive layer 52A and the sacrifice layer 56A may be located at a position different from that shown in the figure. In reality, the boundary between the conductive layer 52A and the sacrifice layer 56A may be positioned closer to the sacrifice layer 56A side the further the wet etching of the sacrifice layer 56A proceeds.

An insulating layer 57 is provided on the perimeter of the side faces of the sacrifice layers 56A and 56B. The insulating layer 57 is made of, for example, silicon oxide.

An insulating layer 58 is provided on the sacrifice layers 56A and 56B and the insulating layer 57. The insulating layer 58 is made of, for example, silicon oxide ($SiO_2$), silicon nitride (SiN), or aluminum oxide (AlO).

The conductive layer 53B is provided above the sacrifice layers 56A and 56B and on the insulating layer 58. The conductive layer 53B is made of the same material as that of the conductive layer 53A, and is formed of a layer that continues with the conductive layer 53A. The conductive layer 53B extends from the conductive layer 53A in the direction X to reach the first contact plugs 40. The first contact plugs 40 pass through the conductive layer 53B at the end portion thereof. The planar shape of the conductive layer 53B is quadrilateral. The conductive layer 53B contacts the insulating film 40A on the perimeter of the first contact plugs 40 and is electrically insulated from the first contact plugs 40.

An insulating layer 59 is provided on the perimeter of the side faces of the conductive layers 53A and 53B. An insulating layer 60 is provided on the conductive layers 53A and 53B and the insulating layer 59. The insulating layers 59 and 60 are made of, for example, silicon oxide.

The interconnect layers 21 to 23 are stacked on the insulating layer 60 with an interlayer insulating layer 31 interposed between the respective interconnect layers. The interlayer insulating layer 31 is made of, for example, silicon oxide.

The width of the sacrifice layer 56A (which is at the same level as the middle layer of the source line SL) in the cross section viewed in the direction Y is smaller than the width of the upper layer 53B and the lower layer 51B in the cross section viewed in the direction Y. Namely, in the cross section taken along line A-A', a part of the region interposed between the conductive layer 53B corresponding to the upper layer of the source line SL and the conductive layer 51B corresponding to the lower layer of the source line SL is the sacrifice layer 56A, and the remaining part is the insulating layer 57.

As shown in FIG. 11, a sacrifice layer that is included in a layer at the same level as the sacrifice layer 56A, and is made of the same material as that of the sacrifice layer 56A, is provided at a lower part of the slit ST. The sacrifice layer is used as an etching stopper when forming the slit ST.

Likewise, a conductive layer that is included in a layer at the same level as the conductive layer 53B, and is made of the same material as that of the conductive layer 53B, is provided at a lower part of the slit ST. The slit ST passes through said conductive layer.

[1-5] First Modification

FIG. 12 is a plan view of the tap section 10B according to a first modification.

The sacrifice layer 56A contacts the conductive layer 52A and reaches the sacrifice layer 56B. The sacrifice layer 56A extends diagonally with respect to the direction X. The sacrifice layer 56A is formed in a linear shape. The direction in which the sacrifice layer 56B extends is discretionary. The cross-sectional structure of the tap section 10B is the same as that of the above-described embodiment.

[1-6] Second Modification

Figure 13:
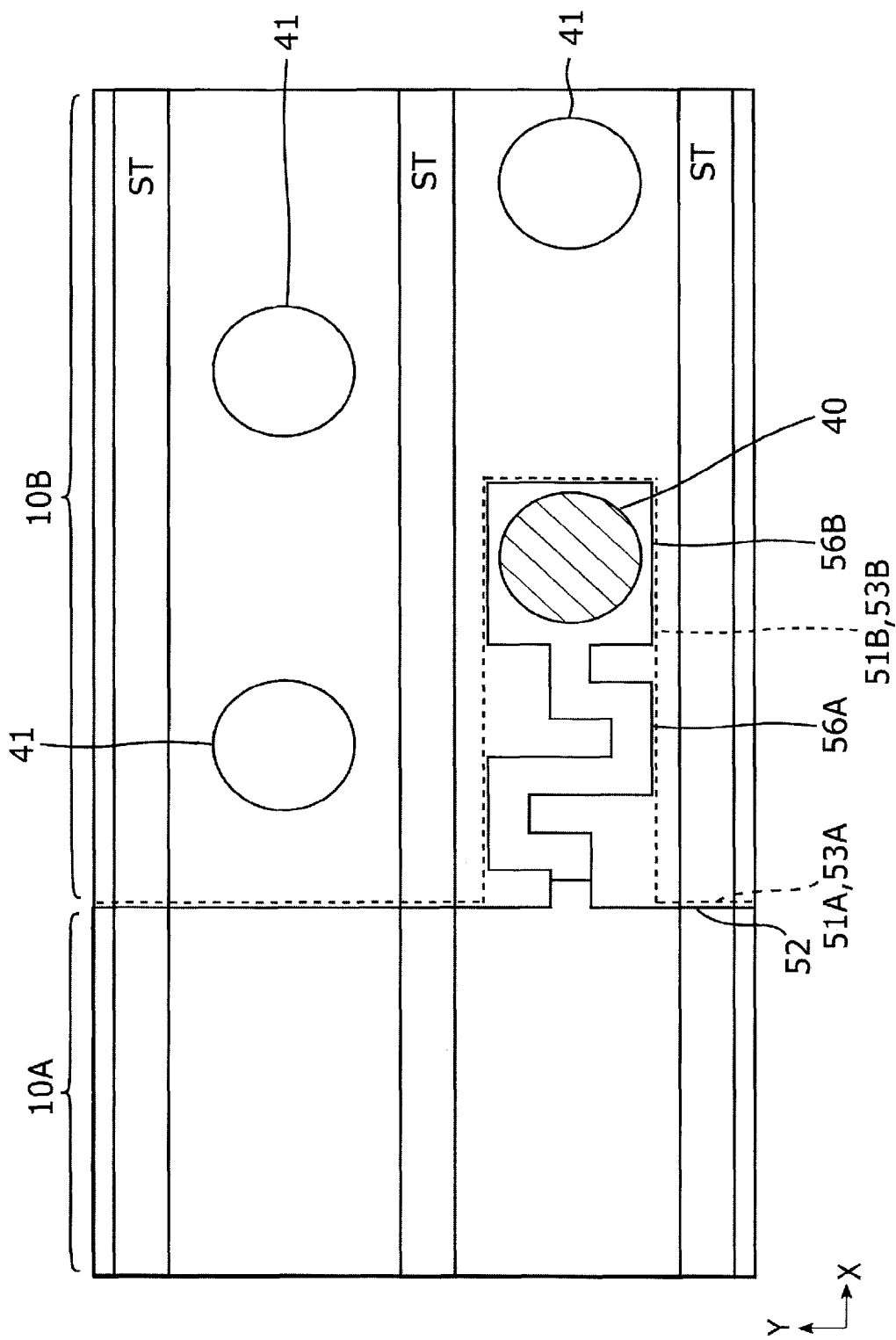
FIG. 13 is a plan view of a tap section according to a second modification, as viewed in the direction XY.

FIG. 13 is a plan view of the tap section 10B according to a second modification.

The sacrifice layer 56A shown in FIG. 13 has more bends than the sacrifice layer 56A shown in FIG. 9. The sacrifice layer 56A is connected to a middle portion of the sacrifice layer 56B (in other words, a portion other than the end portion of the sacrifice layer 56B as viewed in the direction Y). The shape of the bends of the sacrifice layer 56B is discretionary. The cross-sectional structure of the tap section 10B is the same as that of the above-described embodiment.

[1-7] Advantageous Effects of First Embodiment

The semiconductor memory device 1 according to the first embodiment includes: the cell array section 10A in which the memory pillars MP are provided; and the tap section 10B in which the first contact plugs 40 are provided. The semiconductor memory device 1 includes the source line SL (also referred to as an "buried source line") that is buried in a lower part of the memory pillar MP. The source line SL is formed of the conductive layer 51A, the conductive layer 52, and the conductive layer 53A stacked in the mentioned order. The conductive layer 52 is in contact with the semiconductor layer 25, included in the memory pillar MP, to be electrically coupled to the semiconductor layer 25.

Also, the semiconductor memory device 1 includes the first contact plugs 40 electrically coupled to the source line SL. The first contact plugs 40 are electrically coupled to the upper interconnect arranged above the memory pillar MP. Thereby, a voltage can be applied from the upper interconnect to the source line SL via the first contact plugs 40.

The conductive layer 52 included in the source line SL is formed in the region which is itself formed by the performance of wet etching on the sacrifice layer provided in the cell array section 10A, and the removal of this sacrifice layer by said wet etching. This wet etching is a step for partially etching the memory film 26 of the memory pillar MP in order to expose the semiconductor layer 25 of the memory pillar MP. Said sacrifice layer is made of the same material as that of the sacrifice layer 56A provided in the tap section 10B, and is formed of a layer that continues with the sacrifice layer 56A.

As the wet etching of the sacrifice layer proceeds, the sacrifice layer 56A provided in the tap section 10B is etched, and the insulating film 40A provided on the side face of the first contact plugs 40 may also be etched. In this case, the select gate line SGS is exposed by the wet etching, likely causing the source line SL and the select gate line SGS to short-circuit due to the conductive layer 52 formed thereafter.

In contrast, in the present embodiment, the sacrifice layer 56A has a meandering shape, and the width of the sacrifice layer 56A is also narrow. This inhibits an etching liquid used for the wet etching from entering the sacrifice layer 56A. As a result, it is possible to inhibit the wet etching from proceeding to the first contact plugs 40. Accordingly, it is possible to inhibit the source line SL and the select gate line SGS from short-circuiting.

In addition, since short circuit between interconnects can be inhibited, the semiconductor memory device 1 can properly perform a desired operation. Therefore, the performance of the semiconductor memory device 1 can be improved. Furthermore, it is possible to inhibit the semiconductor memory device 1 from having a defect caused by the short circuit between interconnects. Therefore, the yield of the semiconductor memory device 1 can be improved.

[2] Second Embodiment

Figure 14:
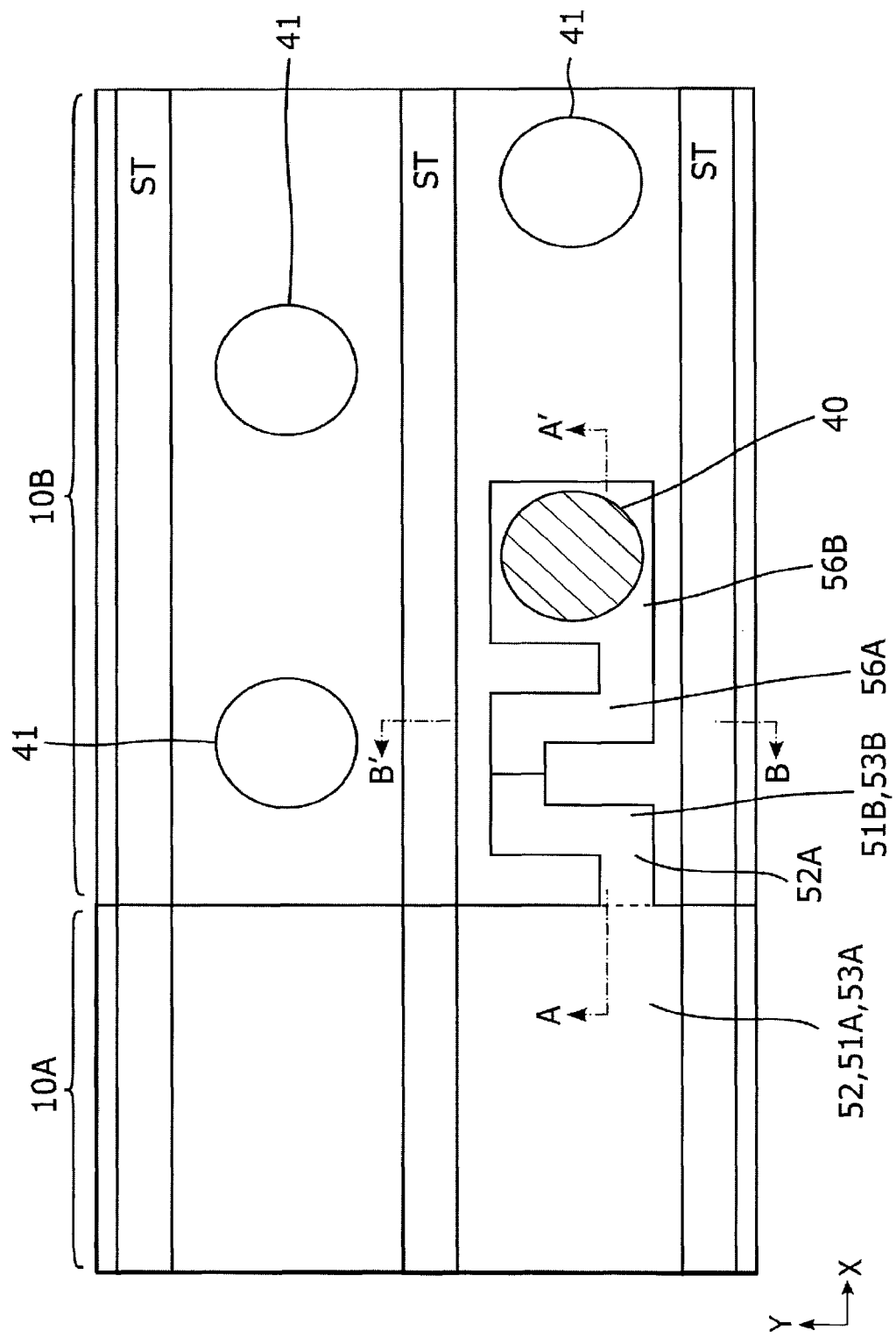
FIG. 14 is a plan view of a tap section 10B according to a second embodiment.
Figure 15:
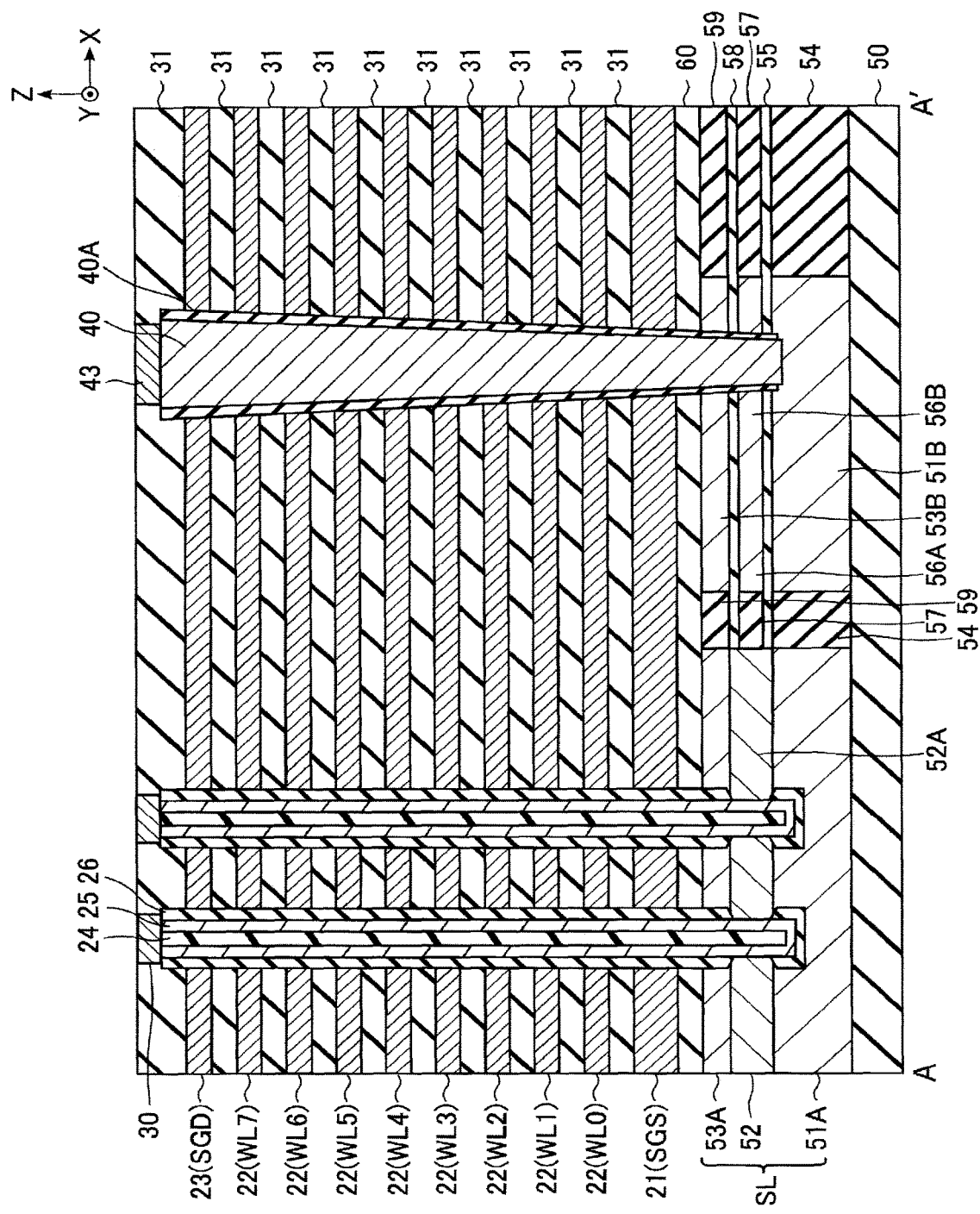
FIG. 15 is a cross-sectional view of the tap section 10B taken along line A-A' in FIG. 14.

A configuration of the tap section 10B according to the second embodiment will be described. FIG. 14 is a plan view of the tap section 10B. FIG. 15 is a cross-sectional view of the tap section 10B taken along line A-A' in FIG. 14. FIG. 16 is a cross-sectional view of the tap section 10B taken along line B-B' in FIG. 14.

The conductive layer 51B has a planar shape that is the same as those of the sacrifice layer 56A and the sacrifice layer 56B. Namely, the conductive layer 51B includes bends in a manner similar to the sacrifice layer 56A. Likewise, the conductive layer 53B has a planar shape that is the same as those of the sacrifice layer 56A and the sacrifice layer 56B. Namely, the conductive layer 53B includes bends in a manner similar to the sacrifice layer 56A. Other than these, the configuration is the same as that of the first embodiment.

In the second embodiment, the conductive layer 51B, the sacrifice layer 56A, the sacrifice layer 56B, and the conductive layer 53B can be processed by a single lithography step. Thus, the manufacturing process can be simplified.

The second embodiment can also be applied to the first and second modifications described in the first embodiment.

[3] Modification, Etc.

The semiconductor memory device according to the above-described embodiments includes: a plurality of first interconnect layers (22, WL, etc.) stacked in a first direction (direction Z); a semiconductor layer (25) extending in the first direction in a first region of the plurality of first interconnect layers; a charge storage film (28) between the plurality of first interconnect layers and the semiconductor layer; a first main body (51A) provided below a lowermost layer of the plurality of first interconnect layers and overlapping with the first region in the first direction; a first conductive layer (51A, 51b) including a first protrusion (51B) that protrudes from the first main body in a second direction crossing the first direction and overlaps in the first direction with a second region adjacent to the first region in the second direction; a contact plug (40) provided on the first protrusion of the first conductive layer and extending in the first direction in the second region of the plurality of first interconnect layers; an insulating film (40A) provided between the contact plug and the plurality of first interconnect layers; a second main body (52) provided on the first main body of the first conductive layer and contacting the semiconductor layer; a second conductive layer (52, 52A) including a second protrusion (52A) provided on the first protrusion and protruding to extend toward the second main body; and a first layer (56A, 56B), provided on the first protrusion, contacting the second protrusion and the insulating film, and extending between the second protrusion and the insulating film. A length of the portion extending between the insulating film and the boundary between the second main body and the second protrusion, in the second protrusion and the first layer, is greater than the linear distance from the boundary between the second main body and the second protrusion to the insulating film.

In the present description, the term "couple" means electrical coupling, and does not exclude, for example, a case where elements are coupled via another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of first interconnect layers stacked in a first direction;
   a semiconductor layer extending in the first direction in a first region of the plurality of first interconnect layers;
   a charge storage layer between the plurality of first interconnect layers and the semiconductor layer;
   a first conductive layer including a first main body and first protrusion, the first main body provided below a lowermost layer of the plurality of first interconnect layers and overlapping with the first region in the first direction, and the first protrusion protruding from the first main body in a second direction crossing the first direction, and overlapping in the first direction with a second region adjacent to the first region in the second direction;
   a contact plug provided on the first protrusion of the first conductive layer and extending in the first direction in the second region of the plurality of first interconnect layers;
   a first insulating layer between the contact plug and the plurality of first interconnect layers;
   a second conductive layer including a second main body and a second protrusion, the second main body provided on the first main body of the first conductive layer and contacting the semiconductor layer, and the second protrusion provided on the first protrusion and protruding to extend toward the second main body; and
   a first layer provided on the first protrusion, contacting the second protrusion and the first insulating layer, and extending between the second protrusion and the first insulating layer,
   wherein a length of a portion extending between the first insulating layer and a boundary between the second main body and the second protrusion, in the second protrusion and the first layer, is greater than a linear distance from the boundary between the second main body and the second protrusion to the first insulating layer.

2. The semiconductor memory device according to claim 1, wherein the second protrusion of the second conductive layer and the first layer is bent.

3. The semiconductor memory device according to claim 1, wherein the first protrusion has a planar shape that is quadrilateral.

4. The semiconductor memory device according to claim 1, wherein the first layer includes amorphous silicon or polycrystal silicon.

5. The semiconductor memory device according to claim 1, wherein the first layer includes silicon (Si) doped with at least one of phosphorus (P), boron (B), or carbon (C).

6. The semiconductor memory device according to claim 1, wherein a material of the second conductive layer is different from a material of the first layer.

7. The semiconductor memory device according to claim 1, further comprising a second insulating layer between the first protrusion and the first layer.

8. The semiconductor memory device according to claim 1, further comprising an interconnect that is provided above the semiconductor layer and electrically coupled to the contact plug.

9. The semiconductor memory device according to claim 1, further comprising: a source line provided below the plurality of first interconnect layers and connected to the semiconductor layer,
wherein the source line includes the first conductive layer and the second conductive layer.

10. The semiconductor memory device according to claim 9, wherein the second conductive layer is in contact with a side surface of the semiconductor layer.

11. The semiconductor memory device according to claim 1, further comprising:
a third insulating layer provided between the second protrusion and the first layer in the second direction.

12. The semiconductor memory device according to claim 1, wherein
the first layer extends diagonally with respect the second direction.

13. The semiconductor memory device according to claim 1, wherein
the first layer includes first portions extending the second direction and second portions extending a third direction crossing to the first and second directions,
the first portions and the second portions are alternately connected.

14. The semiconductor memory device according to claim 1, wherein
a planar shape of the second protrusion is a same as a planar shape of the first layer.

15. The semiconductor memory device according to claim 1, wherein
the first layer faces a side surface of the contact plug via the first insulating film.

* * * * *